US011164745B2

(12) United States Patent
Saly et al.

(10) Patent No.: US 11,164,745 B2
(45) Date of Patent: Nov. 2, 2021

(54) METHOD OF ENHANCING SELECTIVE DEPOSITION BY CROSS-LINKING OF BLOCKING MOLECULES

(71) Applicant: Applied Materials, Inc., Santa Clara, CA (US)

(72) Inventors: Mark Saly, Santa Clara, CA (US); Bhaskar Jyoti Bhuyan, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/631,983

(22) PCT Filed: Aug. 1, 2018

(86) PCT No.: PCT/US2018/044773
§ 371 (c)(1),
(2) Date: Jan. 17, 2020

(87) PCT Pub. No.: WO2019/036188
PCT Pub. Date: Feb. 21, 2019

(65) Prior Publication Data
US 2020/0168453 A1 May 28, 2020

Related U.S. Application Data

(60) Provisional application No. 62/546,899, filed on Aug. 17, 2017, provisional application No. 62/544,893, filed on Aug. 13, 2017.

(51) Int. Cl.
*H01L 21/027* (2006.01)
*H01L 21/32* (2006.01)
(Continued)

(52) U.S. Cl.
CPC .......... *H01L 21/0273* (2013.01); *H01L 21/32* (2013.01); *H01L 21/3205* (2013.01); *H01L 21/76879* (2013.01)

(58) Field of Classification Search
CPC . H01L 21/0273; H01L 21/32; H01L 21/3205; H01L 21/76879; H01L 21/0228; H01L 21/321; H01L 21/3105
See application file for complete search history.

(56) References Cited

U.S. PATENT DOCUMENTS 7,141,844 B1    11/2006  Kingsborough
2002/0071943 A1  6/2002  Hawker et al.
(Continued)

FOREIGN PATENT DOCUMENTS

TW    201721749 A    6/2017

OTHER PUBLICATIONS

"Bottom-Up Engineering of Subnanometer Copper Diffusion Barriers Using NH2 Derived Self-Assembled Monolayers", Advanced Functional Materials, 2010, 20, pp. 1-7.
(Continued)

*Primary Examiner* — John P. Dulka
(74) *Attorney, Agent, or Firm* — Servilla Whitney LLC

(57) ABSTRACT

Methods of depositing a film selectively onto a first substrate surface relative to a second substrate surface are described. The methods include exposing a substrate to a blocking molecule to selectively deposit a blocking layer on the first surface. The blocking layer is exposed to a polymer initiator to form a networked blocking layer. A layer is selectively formed on the second surface. The blocking layer inhibits deposition on the first surface. The networked layer may then optionally be removed.

19 Claims, 1 Drawing Sheet

(51) Int. Cl.
*H01L 21/3205* (2006.01)
*H01L 21/768* (2006.01)

(56) References Cited

U.S. PATENT DOCUMENTS

| | | | |
|---|---|---|---|
| 2004/0087177 A1 | 5/2004 | Colburn et al. | |
| 2004/0203192 A1* | 10/2004 | Gracias | H01L 21/76834 438/118 |
| 2007/0166989 A1* | 7/2007 | Fresco | H01L 21/3105 438/597 |
| 2011/0198736 A1* | 8/2011 | Shero | C23C 16/45525 257/629 |
| 2013/0217238 A1* | 8/2013 | Boussie | H01L 21/76834 438/761 |
| 2014/0273476 A1* | 9/2014 | Cheng | H01L 21/0337 438/703 |
| 2017/0143841 A1 | 5/2017 | Charles et al. | |
| 2019/0322812 A1* | 10/2019 | Wojtecki | C23C 16/405 |

OTHER PUBLICATIONS

PCT International Search Report and Written Opinion in PCT/US2018/044773 dated Oct. 31, 2018, 15 pages.
"Unusual aggregates from the oxidation of alkene self-assembled monolayers: a previously unrecognized mechanism for SAM ozonolysis?", Phys. Chem. Chem. Phys., 2005, 7, pp. 3605-3609.
Adamkiewicz, Malgorzata, "Self-Assembled Monolayers on Silicon: Deposition and Surface Chemistry", Thesis, Doctor of Philosophy at the University of St. Andrews, Jun. 2013, 168 pages.
Jadhav, Sushilkumar A., "Self-assembled monolayers (SAMs) of carboxylic acids: an overview", Central European Journal of Chemistry, pp. 369-378.

* cited by examiner

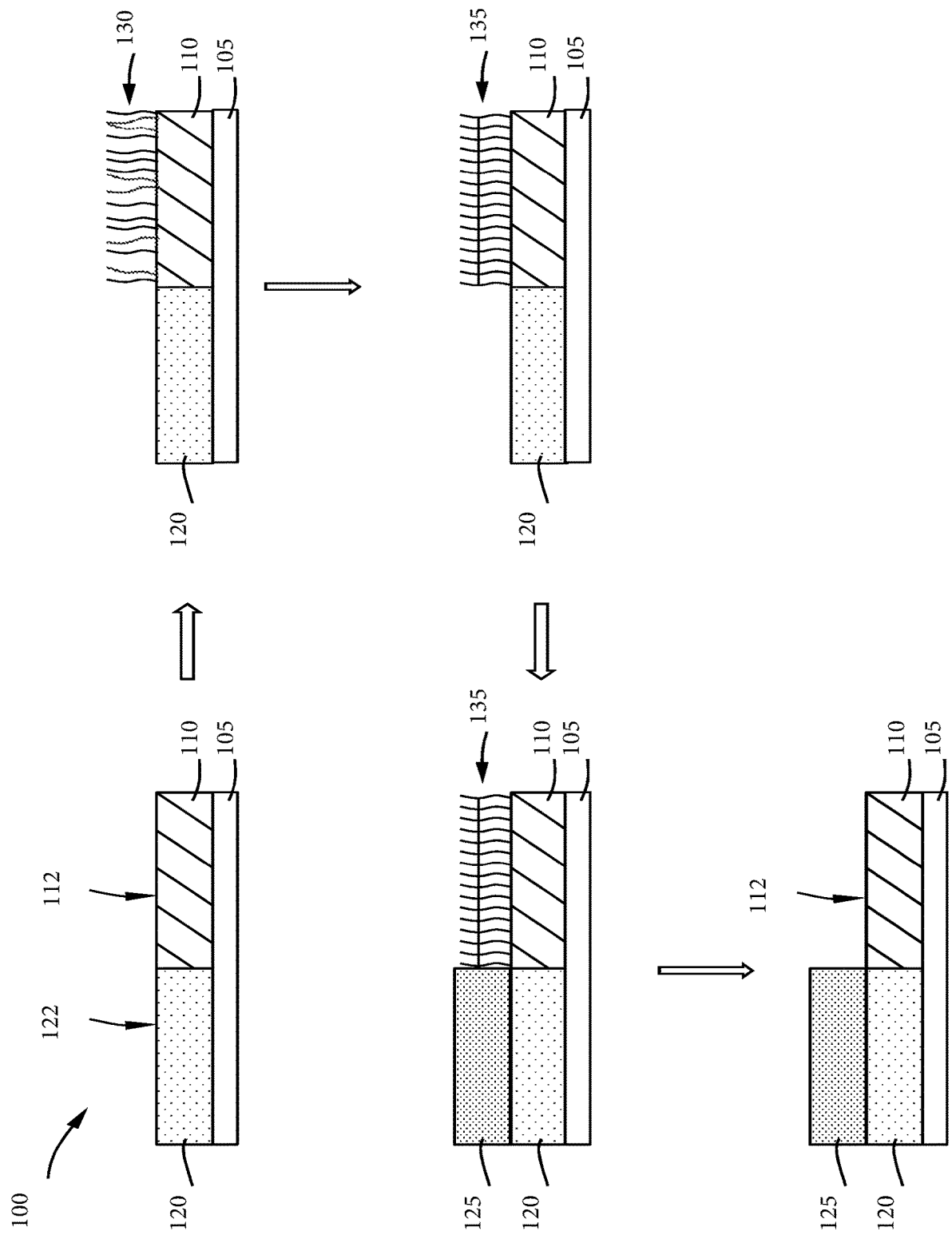

METHOD OF ENHANCING SELECTIVE DEPOSITION BY CROSS-LINKING OF BLOCKING MOLECULES

CROSS-REFERENCE TO RELATED APPLICATIONS

This application is the National Stage entry of PCT/US18/44773, filed on Aug. 1, 2018, which claims priority to U.S. Provisional Application. Ser. No. 62/546,899, filed Aug. 17, 2017 and U.S. Provisional Application Ser. No. 62/544,893, filed Aug. 13, 2017, the entire disclosures of which are hereby incorporated herein in their entireties.

FIELD

Embodiments of the disclosure generally relate to methods of enhancing selective deposition of a film using self-assembled monolayers. More particularly, embodiments of the disclosure are directed to methods of enhancing selective deposition of a film using self-assembled monolayers which are cross-linked by a treatment reactant.

BACKGROUND

Another potential application for selective deposition is gap fill. In gap fill, the fill film is grown selectively from the bottom of a trench towards the top. Selective deposition could be used for other applications such as selective sidewall deposition where films are grown on the side of the fin. This would enable the deposition of a sidewall spacer without the need for complex patterning steps.

The semiconductor industry faces many challenges in the pursuit of device miniaturization including the rapid scaling of nanoscale features. Such challenges include the fabrication of complex devices, often using multiple lithography steps and etches. Furthermore, the semiconductor industry needs low cost alternatives to high cost EUV for patterning complex architectures. To maintain the cadence of device miniaturization and keep chip manufacturing costs down, selective deposition has shown promise. It has the potential to remove costly lithographic steps by simplifying integration schemes.

Selective deposition of materials can be accomplished in a variety of ways. For instance, some processes may have inherent selectivity to surfaces based on their surface chemistry. These processes are fairly rare and usually need to have surfaces with drastically different surface energies, such as metals and dielectrics.

In cases where surfaces are similar ($SiO_2$ versus Si—H term or SiN) the surfaces need to be selectively blocked by employing surface treatments that selectively react with one surface and not the other, effectively blocking any surface reactions during later ALD or CVD processes.

Selective blocking of $SiO_2$ is one of the key problem statements as enabling it would allow for the growth of films over silicon or metals without undergoing any lithographic or etching step. Although a few classes of molecules such as alkyl silyl amides, alkyl silyl halides, and alkyl silyl alkoxides are known to block $SiO_2$ selectively, ALD processes lose selectivity after a few cycles due to typically poor packing of the alkyl/aryl chain. Poor packing of these non-polar tail groups leads to nucleation of ALD process reactants and products, leading to loss of selectivity.

Therefore, there is a need in the art for a method to selectively block a surface and cross link the tail groups to form a dense network of the blocking molecules so that the nucleation of ALD precursors is eliminated or delayed significantly as compared to present blocking methods.

SUMMARY

One or more embodiments of the disclosure are directed to a method of selective deposition. The methods comprise providing a substrate with a first material with a first surface and a second material with a second surface. The substrate is exposed to a blocking compound comprising at least one blocking molecule to selectively deposit a blocking layer on the first surface relative to the second surface. The blocking molecule has the general formula A-L-Z where A is a reactive head group, L is a linking group and Z is a reactive tail group. The blocking layer is exposed to a polymer initiator to form a networked blocking layer on the first surface. A layer is formed selectively on the second surface relative to the first surface. The networked blocking layer inhibits deposition of the layer on the first surface.

Further embodiments of the disclosure are directed to a method of selective deposition. The method comprises providing a substrate with a first material comprising silicon oxide with a first surface and a second material comprising silicon metal with a second surface. The substrate is exposed to a blocking compound comprising at least one blocking molecule to selectively deposit a blocking layer on the first surface relative to the second surface. The blocking molecule has the general formula $((CH_3)_2N)_3SiC_6H_{12}COOH$. The blocking layer is exposed to a polymer initiator comprising ethylene diamine to form a networked blocking layer on the first surface. A layer is formed selectively on the second surface relative to the first surface. The networked blocking layer inhibits deposition of the layer on the first surface.

Further embodiments of the disclosure are directed to a method of selective deposition. The method comprises providing a substrate with a first material comprising cobalt with a first surface and a second material comprising silicon oxide with a second surface. The substrate is exposed to a blocking compound comprising at least one blocking molecule to selectively deposit a blocking layer on the first surface relative to the second surface. The blocking molecule has the structure of Compound II. The blocking layer is exposed to a polymer initiator comprising AIBN to form a networked blocking layer on the first surface. A layer is formed selectively on the second surface relative to the first surface. The networked blocking layer inhibits deposition of the layer on the first surface.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

The FIGURE illustrates a processing method in accordance with one or more embodiment of the disclosure.

DETAILED DESCRIPTION

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used. In one or more embodiments, the first substrate surface may comprise a metal, metal oxide, or H-terminated $Si_xGe_{1-x}$, and the second substrate surface may comprise a Si-containing dielectric, or vice versa. In some embodiments, a substrate surface may comprise certain functionality (e.g., —OH, —NH, etc.).

As used in this specification and the appended claims, the terms "reactive gas", "precursor", "reactant", and the like, are used interchangeably to mean a gas that includes a species which is reactive with a substrate surface. For example, a first "reactive gas" may simply adsorb onto the surface of a substrate and be available for further chemical reaction with a second reactive gas.

In recent decades, the semiconductor community has made attempts to improve integrated circuit (IC) processing by replacing lithography steps with alternatives that translate to lower cost, reduced processing time, and smaller feature sizes. Many of these alternatives fall under the blanket category of "selective deposition." In general, selective deposition refers to a process for which the net deposition rate is higher on the target substrate material relative to other substrate materials, such that the desired film thickness is achieved on the target substrate material with less or negligible deposition on the other substrate materials (where "negligible" is defined by process constraints).

Embodiments of the disclosure provide methods of selectively depositing a film onto one surface over a second surface. As used in this specification and the appended claims, the term "selectively depositing a film on one surface over another surface", and the like, means that a first amount of the film is deposited on the first surface and a second amount of film is deposited on the second surface, where the second amount of film is less than the first amount of film, or no film is deposited on the second surface. The term "over" used in this regard does not imply a physical orientation of one surface on top of another surface, rather a relationship of the thermodynamic or kinetic properties of the chemical reaction with one surface relative to the other surface. For example, selectively depositing a cobalt film onto a copper surface over a dielectric surface means that the cobalt film deposits on the copper surface and less or no cobalt film deposits on the dielectric surface; or that the formation of the cobalt film on the copper surface is thermodynamically or kinetically favorable relative to the formation of a cobalt film on the dielectric surface.

One strategy to achieve selective deposition employs the use of blocking layers. Ideally, this strategy involves (1) formation of a blocking layer on substrate materials on which deposition is to be avoided with negligible impact to the target substrate material, (2) deposition on the target substrate material (where deposition on other substrate materials is "blocked" by the blocking layer), and (3) optional removal of the blocking layer without net adverse effects to the deposited film.

Embodiments of the disclosure incorporate a blocking layer typically referred to as a self-assembled monolayer (SAM). A self-assembled monolayer (SAM) consists of an ordered arrangement of spontaneously assembled organic molecules adsorbed on a surface. These molecules are typically comprised of one or more moieties with an affinity for the substrate (head group) and a relatively long, inert, linear hydrocarbon moiety (tail group).

In this case, SAM formation happens through fast adsorption of molecular head groups at the surface and slow association of molecular tail groups with each other through van der Waals interactions. SAM precursors are chosen such that the head group selectively reacts with the substrate materials to be blocked during deposition. Deposition is then performed, and the SAMs can be removed through thermal decomposition (with desorption of any byproducts) or an integration-compatible ashing process. Successful selective deposition through this idealized formation and use of SAMs has been demonstrated for a number of systems; however, success is essentially limited to a solution-based approach for SAM formation (i.e., wet functionalization). Wet functionalization approaches are not only incompatible with vacuum-based integration schemes but also often require sonication post-SAM formation to eliminate physisorbed SAM precursor. This suggests successful selective SAM formation (on one substrate versus another) cannot rely on the functionalization process alone to yield the overall selective chemisorption result with no physisorption.

Referring to the FIGURE, one or more embodiment of the disclosure is directed to a processing method 100 for selective deposition. A substrate 105 is provided with a first material 110 and a second material 120. The first material 110 has a first surface 112 and the second material 120 has a second surface 122.

In some embodiments, the first material comprises a metal oxide or a dielectric material and the second material comprises a metal or silicon. In some embodiments, the first material consists essentially of silicon oxide.

In some embodiments, the second material comprises a metal oxide or a dielectric material and the first material comprises a metal or silicon. In some embodiments, the second material consists essentially of silicon oxide.

As used in this specification and the appended claims, the term "consists essentially of" means that greater than or equal to about 95%, 98% or 99% of the specified material is the stated material.

The first surface 112 is exposed to a blocking compound to selectively deposit a blocking layer 130 on the first surface 112 over the second surface 122. The blocking layer is exposed to a polymer initiator to form a networked blocking layer 135.

The blocking compound comprises at least one blocking molecule. A blocking molecule has the general formula A-L-Z, where A is a reactive head group, L is a linking group and Z is a reactive tail group.

As used in this manner, the "head group" is a chemical moiety that associates with the first surface 112 and the "tail group" is a chemical moiety that extends away from the first surface 112.

In some embodiments, the first material comprises a metal oxide or a dielectric material and A is selected from the group consisting of $(R_2N)_{(3-a)}R'_aSi—$, $X_3Si—$ and $(RO)_3Si—$, where each R and R' is independently selected from C1-C6 alkyl, C1-C6 cycloakyl and C1-C6 aryl, a is an integer from 0 to 2, and each X is independently selected from halogens.

In some embodiments, the first material comprises a metal or silicon and A is selected from the group consisting of $(HO)_2OP—$, $HS—$ and $H_3Si—$.

Some of the reactive head groups listed above comprise more than one reactive moiety in a single reactive head group (e.g. $H_3Si—$ may bond up to three times with the surface) which is attached to linking group, L. In some embodiments, A is selected from reactive groups where less than the number of reactive moieties listed above and are attached to more than one linking group, L. In these embodiments, the linking groups may be the same or different. In these embodiments, the tail groups may be the same or different.

The blocking compound can be delivered to the substrate as a single compound or sequential exposures of multiple compounds to form a blocking layer 130. In some embodiments, the first surface 112 is exposed to a single compound that assembles on the surface in an ordered or semi-ordered manner.

In some embodiments, L is $—(CH_2)_n—$ and n is an integer from 4 to 18. In some embodiments, the linking group may be branched. In some embodiments, the linking group may be substituted. In some embodiments, the linking group may be unsaturated. In some embodiments, the linking group may comprise cycloakyl or aryl groups.

In some embodiments, the linking group L comprises less than 18 carbon atoms. In some embodiments, the linking group comprises less than 17, 16, 15, 14, 13, 12, 11, 10, 9, 8, 7, 6, or 5 carbon atoms.

In some embodiments, Z is a group comprising one or more reactive moiety selected from alkenes, alkynes, alcohols, carboxylic acids, aldehydes, acyl halides, amines, amides, cyanates, isocyanates, thiocyanates, isothiocyanates, or nitriles.

In some embodiments, the blocking molecule comprises more than one reactive moiety. In some embodiments, A is linked to more than one linking group each terminated with a reactive tail group, such that a blocking molecule comprises more than one reactive moiety. In some embodiments, L is branched, such that a blocking molecule comprises more than one reactive moiety. In some embodiments, the blocking molecule comprises more than one reactive moiety and the reactive moieties are positioned in a linear fashion. In some embodiments, Z comprises more than one reactive moiety and the reactive moieties are positioned in a branched fashion.

As used in this manner, reactive moieties positioned in a linear fashion are positioned within a blocking molecule such than they are positioned within the same carbon chain. In other words, they are positioned end-to-end. As used in this manner, reactive moieties positioned in a branched fashion are positioned within a blocking molecule such than they are positioned on different carbon chains. In other words, they are not positioned end-to-end. In some embodiments, the reactive moieties may be separated by intervening atoms but still be considered end-to-end.

For example, Compound I contains one reactive moiety. Compounds II and III contain two reactive moieties. Compound II has reactive moieties positioned in a linear fashion. Compound III has reactive moieties positioned in a branched fashion.

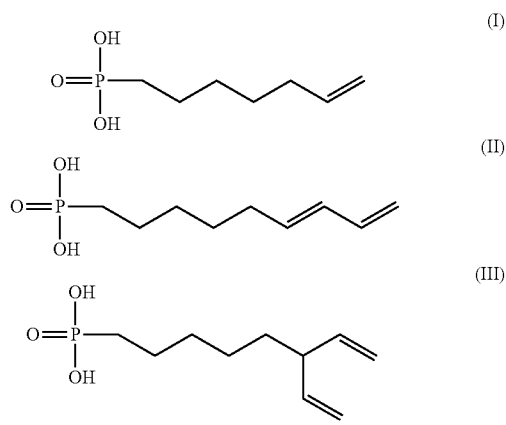

In some embodiments, the tail groups associate with each other through relatively slow van der Waals interaction. In some embodiments, the tail groups can be the same or different so that a homogeneous or heterogeneous SAM can be formed. In some embodiments, the blocking compound comprises at least two different blocking molecules so that a heterogenous SAM is formed.

Once formed, the blocking layer 130 is exposed to a polymer initiator to form the networked blocking layer 135. The polymer initiator can be any suitable process including, but not limited to, a chemical reaction, UV light exposure, electron beam exposure and/or heat.

In some embodiments, the polymer initiator comprises one or more of radiation treatment, thermal treatment, plasma treatment or chemical treatment. In some embodiments, the radiation treatment comprises exposing the blocking layer to UV-visible radiation in the range of about 150 nm to about 900 nm. In some embodiments, the thermal treatment comprises annealing the substrate to react the blocking molecules. In some embodiments, the plasma treatment comprises plasmas generated from a remote plasma source, a direct plasma source, microwave plasma or a combination of these sources. In some embodiments, the chemical treatment comprises exposing the blocking layer to one or more chemical reactants.

In some embodiments, the polymer initiator consists essentially of radiation treatment or thermal treatment. In these embodiments, the networked blocking layer is not formed by exposing the blocking layer to a chemical reactant.

In some embodiments, the polymer initiator comprises a chemical treatment comprising a radical initiator selected from peroxides, organometallic complexes, or azobisisobutyronitrile (AIBN). Without being bound by theory, in these embodiments, the blocking layer forms a networked blocking layer through radical polymerization.

In some embodiments, the chemical treatment comprises exposing the blocking layer to a chemical reactant. In some embodiments, the chemical reactant comprises multiple functional groups. In some embodiments, the chemical treatment comprises exposing the blocking layer to an amine or an alcohol. In some embodiments, the amine or the alcohol comprises multiple functional groups.

In some embodiments, the chemical reactant comprises an amine with a carbon chain (e.g., an alkyl amine). In some embodiments, the alkyl amine comprises more than one amino group and the amino groups are positioned in a linear fashion. In some embodiments, the alkyl amine comprises more than one amino group and the amino groups are positioned in a branched fashion. The terms "linear fashion" and "branched fashion" are described above with respect the reactive moieties of a blocking compound.

Exemplary amines for use as chemical reactants include, but are not limited to, primary amines and secondary amines. In some embodiments, the amine comprises a diamine with an intervening carbon chain between the amino groups. For example, in some embodiments, the amine comprises ethylene diamine. In some embodiments, the amine comprises an amine with a pendant carbon chain. For example, in some embodiments, the amine comprises octadecylamine ($C_{18}H_{37}NH_2$).

In some embodiments, the chemical reactant comprises an alcohol with a carbon chain. In some embodiments, the alcohol comprises more than one hydroxyl group and the hydroxyl groups are positioned in a linear fashion. In some embodiments, the alcohol comprises more than one hydroxyl group and the hydroxyl groups are positioned in a branched fashion. The terms "linear fashion" and "branched fashion" are described above with respect the reactive moieties of a blocking compound.

Exemplary alcohols for use as chemical reactants include, but are not limited to, primary alcohols, secondary alcohols and tertiary alcohols. In some embodiments, the alcohol comprises two hydroxyl groups with an intervening carbon chain between the hydroxyl groups. For example, in some embodiments, the alcohol comprises one or more of ethylene glycol, propylene glycol, or glycerol. In some embodiments, the alcohol comprises an alcohol with a pendant carbon chain. For example, in some embodiments, the alcohol comprises octadecyl alcohol ($C_{18}H_{37}OH$).

Further, in some embodiments, the chemical reactant may comprise a chemical species comprising an amino group and a hydroxyl group. These differing substituents may be arranged in any combination (e.g. linear, branched, with an intervening or pendant carbon chain).

Without being bound by theory, reactions of reactive groups with a polymer initiator may form a networked blocking layer. For example, reaction of alkenes or alkynes with UV, thermal, chemical reactants or plasma may produce carbon based polymers. The reaction of carboxylic acids, aldehydes or acyl halides with multifunctional amines may produce polyamides. The reaction of isocyanato groups with alcohols may produce polyurethanes. The reaction of carboxylic acids, aldehydes or acyl halides with alcohols may produce polyesters.

After formation of the networked blocking layer 135, a layer 125 is selectively formed on the second surface 122 of the second material 120 over the networked blocking layer 135. The networked blocking layer 135 provides a protecting group to prevent or minimize deposition of the layer 125 on the first surface 112. In some embodiments, the layer 125 is a different material than the second material 120. In some embodiments, the layer 125 is the same material as the second material 120.

Without being bound by theory, the gas phase reaction of the blocking compound with the substrate is facilitated by blocking molecules with higher volatility or higher vapor pressure. In some embodiments, the blocking compound has a vapor pressure greater than or equal to about 0.1 mm Hg at 25° C., 0.2 mm Hg at 25° C., 0.3 mm Hg at 25° C., 0.4 mm Hg at 25° C., 0.5 mm Hg at 25° C., 0.6 mm Hg at 25° C., 0.7 mm Hg at 25° C., 0.8 mm Hg at 25° C., 0.9 mm Hg at 25° C., 1 mm Hg at 25° C., 5 mm Hg at 25° C., 10 mm Hg at 25° C., 50 mm Hg at 25° C., 100 mm Hg at 25° C., 200 mm Hg at 25° C., 300 mm Hg at 25° C., 400 mm Hg at 25° C. or 500 mm Hg at 25° C.

In some embodiments, the networked blocking layer inhibits the deposition of the layer on the first surface. Without being bound by theory, it is believed that the networked blocking layer is more effective at blocking the deposition of the layer than the blocking layer before it is exposed to the polymer initiator. In some embodiments, the networked blocking layer has a water contact angle greater than or equal to about 80°.

In some embodiments, after selective deposition of the layer 125 on the second material 120, the networked blocking layer 135 is removed from the first surface. In some embodiments, the networked blocking layer 135 is removed from the surface by oxidation. In some embodiments, the networked blocking layer 135 is etched from the surface. In some embodiments, the networked blocking layer 135 is dissolved in a suitable solvent (e.g., ethanol).

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method of selective deposition comprising:
providing a substrate with a first material with a first surface and a second material with a second surface, the second material comprises a metal oxide or a dielectric material and the first material comprises a metal or silicon;
exposing the substrate to a blocking compound comprising at least one blocking molecule to selectively deposit a blocking layer on the first surface relative to the second surface, the blocking molecule having the general formula A-L-Z where A is a reactive head group, L is a linking group and Z is a reactive tail group;
exposing the blocking layer to a polymer initiator to form a networked blocking layer on the first surface; and
forming a layer selectively on the second surface relative to the first surface,
wherein the networked blocking layer inhibits deposition of the layer on the first surface.

2. The method of claim 1, wherein the first material comprises a metal oxide or a dielectric material and the second material comprises a metal or silicon.

3. The method of claim 2, wherein A is selected from the group consisting of $(R_2N)_aR'_bSi-$, $X_3Si-$ and $(RO)_3Si-$, where each R and R' is independently selected from C1-C6 alkyl, C1-C6 cycloakyl and C1-C6 aryl, a and b are integers such that a+b equals 3, and each X is independently selected from halogens.

4. The method of claim 2, wherein the first material consists essentially of silicon oxide.

5. The method of claim 1, wherein A is selected from the group consisting of $(HO)_2OP-$, $HS-$ and $H_3Si-$.

6. The method of claim 1, wherein L is $-(CH_2)_a-$ and n is an integer from 4 to 18.

7. The method of claim 6, wherein n is 4 to 8.

8. The method of claim 1, wherein Z is a group comprising one or more reactive moiety selected from alkenes, alkynes, alcohols, carboxylic acids, aldehydes, acyl halides, amines, amides, cyanates, isocyanates, thiocyanates, isothiocyanates, or nitriles.

9. The method of claim 8, wherein the blocking molecule comprises more than one reactive moiety.

10. The method of claim 9, wherein the reactive moieties are positioned in a linear fashion.

11. The method of claim 9, wherein the reactive moieties are positioned in a branched fashion.

12. The method of claim 1, wherein the blocking compound comprises at least two different blocking molecules.

13. The method of claim 1, wherein the polymer initiator comprises one or more of a radiation treatment, a thermal treatment, plasma treatment or chemical treatment.

14. The method of claim 13, wherein the polymer initiator consists essentially of radiation treatment or thermal treatment.

15. The method of claim 13, wherein the chemical treatment comprises a radical initiator selected from peroxides, organometallic complexes, or azobisisobutyronitrile (AIBN).

16. The method of claim 13, wherein the chemical treatment comprises exposing the blocking layer to an amine or alcohol with multiple functional groups.

17. The method of claim 1, wherein the second surface consists essentially of silicon oxide.

18. A method of selective deposition comprising:
providing a substrate with a first material comprising silicon oxide with a first surface and a second material comprising silicon metal with a second surface;
exposing the substrate to a blocking compound comprising at least one blocking molecule to selectively deposit a blocking layer on the first surface relative to the second surface, the blocking molecule having the general formula $((CH_3)_2N)_3SiC_6H_{12}COOH$;
exposing the blocking layer to a polymer initiator comprising ethylene diamine to form a networked blocking layer on the first surface; and
forming a layer selectively on the second surface relative to the first surface, wherein the networked blocking layer inhibits deposition of the layer on the first surface.

19. A method of selective deposition comprising:
providing a substrate with a first material comprising cobalt with a first surface and a second material comprising silicon oxide with a second surface;
exposing the substrate to a blocking compound comprising at least one blocking molecule to selectively deposit a blocking layer on the first surface relative to the second surface, the blocking molecule having the structure

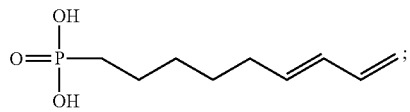

exposing the blocking layer to a polymer initiator comprising AIBN to form a networked blocking layer on the first surface; and
forming a layer selectively on the second surface relative to the first surface, wherein the networked blocking layer inhibits deposition of the layer on the first surface.

* * * * *